United States Patent [19]
Flegeo

[11] Patent Number: 6,126,454
[45] Date of Patent: Oct. 3, 2000

[54] CONTACT DEVICE BETWEEN A LIQUID CRYSTAL DISPLAY AND A PRINTED CIRCUIT

[75] Inventor: Arnaud Flegeo, Challes, France

[73] Assignee: U.S. Philips Corporation, New York, N.Y.

[21] Appl. No.: 09/289,847

[22] Filed: Apr. 12, 1999

[30] Foreign Application Priority Data

Apr. 16, 1998 [FR] France ................................. 98 04729

[51] Int. Cl.⁷ ................................................. H01R 12/00
[52] U.S. Cl. ............................................................ 439/67
[58] Field of Search ............................. 439/67, 76, 736; 361/816, 749, 395, 790, 799, 800, 818, 814, 803, 804, 737; 364/708.1; 349/62, 64, 162; 174/52.3, 254, 252, 257; 200/512, 51 R

[56] References Cited

U.S. PATENT DOCUMENTS

| | | | |
|---|---|---|---|
| 4,317,011 | 2/1982 | Marzurk | 200/512 |
| 5,357,065 | 10/1994 | Mitamura et al. | 200/512 |
| 5,636,105 | 6/1997 | Inomata et al. | 361/816 |
| 5,684,550 | 11/1997 | Shibata et al. | 349/62 |
| 6,005,210 | 2/2000 | Chien | 200/51 R |
| 6,023,147 | 2/2000 | Cargin, Jr. et al. | 364/708.1 |

FOREIGN PATENT DOCUMENTS 215085  7/1997  Japan ..................................... 320/114

OTHER PUBLICATIONS

By Philips Components "Connecting Techniques" of the Manual Entitled "Data Handbook: Liquid Crystal Displays and Driver ICs for LCD" and Referenced "LCD Jan.–1991" Published By Philips Components in Jul. 1990 pp. 27–28.

*Primary Examiner*—Brian Sircus
*Assistant Examiner*—J. F. Duverne
*Attorney, Agent, or Firm*—Dicran Halajian

[57] ABSTRACT

An electronic equipment includes a contact device for establishing electrical contact between a liquid crystal display and a printed circuit board of the electronic equipment. The contact device has an elastic sheet. Keys of the electronic equipment itself are molded in the elastic sheet which also includes a tab with contact tracks on its back face. The contact tracks of the tab provide electrical connection between the display and the printed circuit board.

10 Claims, 2 Drawing Sheets

CONTACT DEVICE BETWEEN A LIQUID CRYSTAL DISPLAY AND A PRINTED CIRCUIT

FIELD OF THE INVENTION

The invention relates to electronic equipment comprising a liquid crystal display, a printed circuit and an electrical contact device between said display and said printed circuit. The invention also relates to a device intended to establish an electrical contact between a liquid crystal display and a printed circuit of electronic equipment with keys, and a sheet of elastic material in which keys are molded, and which is intended to be used in electronic equipment that comprises a display and a printed circuit linked by an electrical contact device.

The invention has important applications in the field of consumer electronics, notably in telephones.

BACKGROUND OF THE INVENTION

Such equipment is notably described in the paragraph "Connecting Techniques" pp. 27 and 28 of the manual entitled "Data Handbook: Liquid Crystal Displays and Driver ICs for LCD" and referenced "LCD 01-1991" published by Philips Components in July 1990.

As indicated in that document, two elastomer bands are currently used as a contact device, which bands are formed by an alternation of conducting and insulating sections which support the display and electrically connect it to the printed circuit (such bands are also known by the name of Zebra contact). Such a prior-art contact device is represented by way of example in FIG. 1. The display 1 comprises an upper pane 10 and a lower pane 11. The upper pane 10 protrudes relative to the lower pane 11 thus clearing two bands 12 and 13 on its lower surface 14. These two bands carry the contacts 15 of the display 1. These contacts 15 are connected to the printed circuit 20 by the conducting sections 30 of two elastomer bands. The contact is ensured by a device 50, which is a mechanical pressure device between the display 1, the contact device and the printed circuit 20.

Such devices offer complete satisfaction, but are relatively costly. The invention has for its object to propose equipment whose contact device has a much lower cost level.

SUMMARY OF THE INVENTION

Therefore, equipment according to the invention is characterized in that it includes a sheet of elastic material in which keys of said equipment are molded, said contact device being formed by a tab realized in said sheet and carrying one or various contact tracks.

The invention thus consists of utilizing a sheet of elastic material that exists in the equipment anyway (here it is the sheet in which the keys of the equipment are molded), for realizing the contact device. The invention thus enables to divide the cost of the contact device by about three.

Similarly, a device according to the invention and as described in the opening paragraph is characterized in that it is formed by a tab that carries one or various contact tracks, which is realized in a sheet of elastic material of said equipment in which said keys are molded.

And a sheet of elastic material according to the invention and as described in the opening paragraph is characterized in that it comprises a tab that carries conducting tracks intended to form such a contact device.

BRIEF DESCRIPTION OF THE DRAWINGS

These and other aspects of the invention are apparent from and will be elucidated, by way of non-limitative example, with reference to the embodiments described hereinafter.

In the drawings.

DESCRIPTION OF PREFERRED EMBODIMENTS

Figure 1:
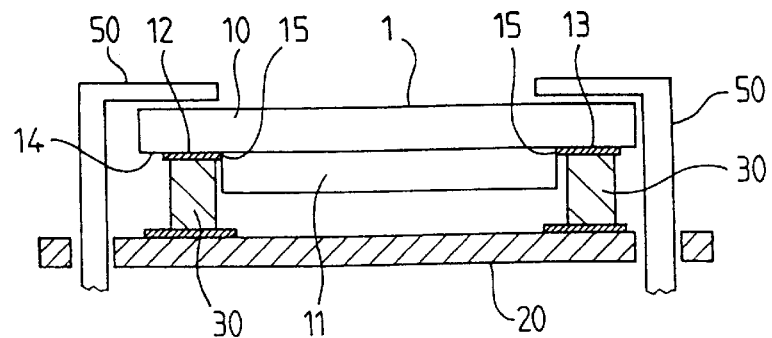
FIG. 1 represents equipment comprising a prior-art contact device.
Figure 3:
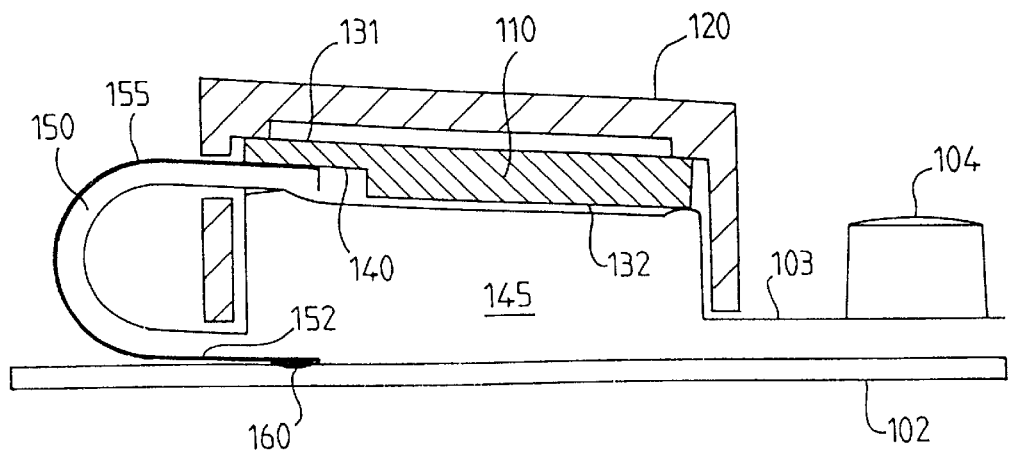
FIG. 3 represents a cross-sectional view of a part of the invention of FIG. 2.
Figure 2:
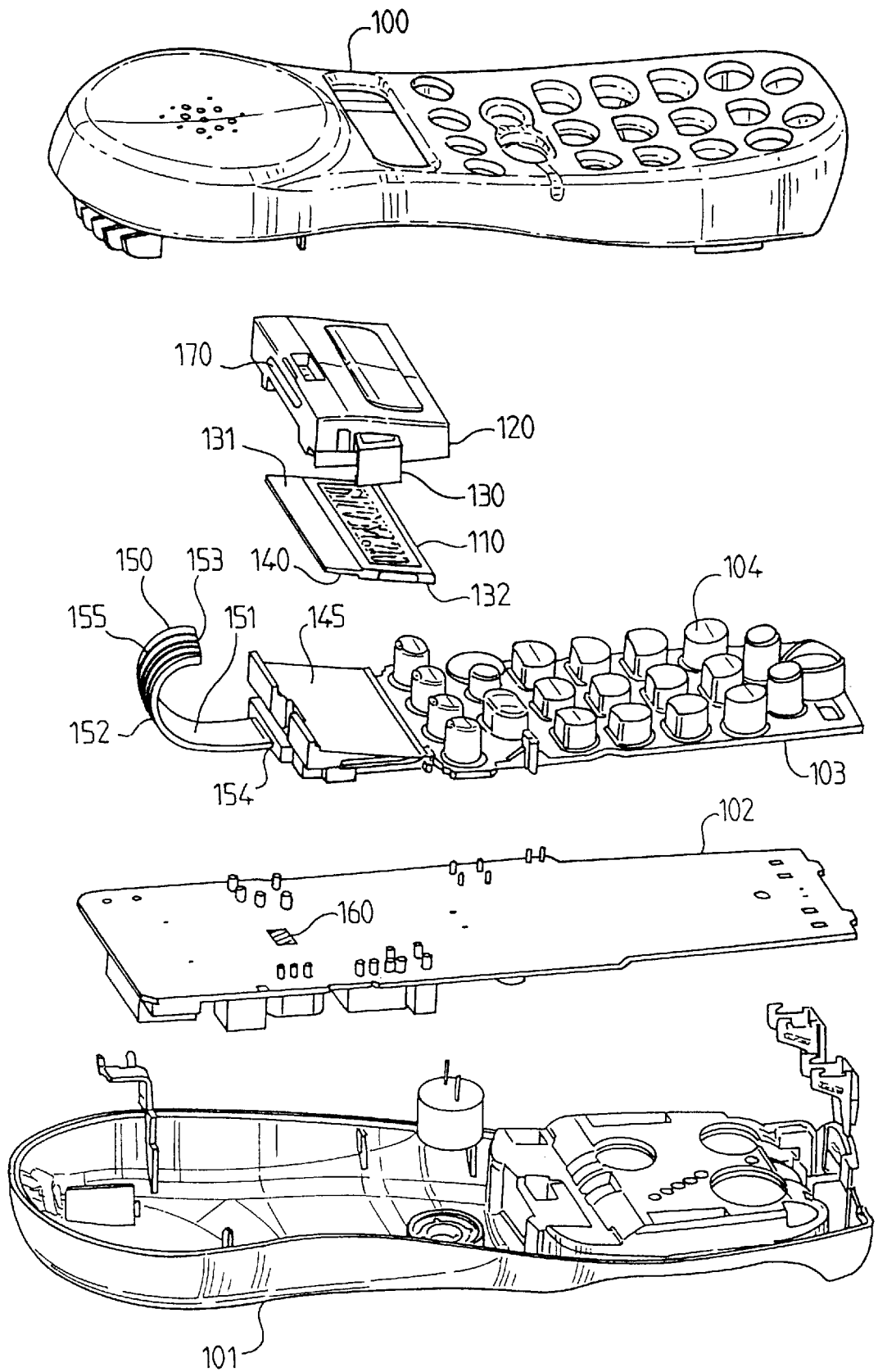
FIG. 2 represents an exploded view of an example of equipment according to the invention.

In FIG. 2 is represented a diagrammatic exploded view of an example of equipment according to the invention and in FIG. 3 is represented a cross-sectional view of a part of this same equipment. The common elements of the two Figures carry like reference characters.

The equipment represented in FIGS. 2 and 3 is a mobile telephone notably comprising a shell in two halves 100 and 101 and, inside this shell, a printed circuit 102, a sheet 103 of elastomer in which keys 104 of the equipment are molded, a liquid crystal display 110 and a window device 120 that is placed on the display 110. The assembly formed by the window 120, the display 110, the elastomer sheet 103 and the printed circuit 102 is kept in place by two clips 130 (only a single one of the clips appears in FIG. 2).

The display 110 has a front face 131 and a back face 132, and a contact area 140 on its back face 132.

The sheet of plastic material 103 comprises, in addition to the keys 104, a support 145 for the display 110 and a tab 150 having a front face 151, a back face 152, a free end 153 and a fixed end 154. The tab 150 carries various contact tracks 155 on its back face 152. When the sheet 103 rests on the printed circuit 102, the tracks 155 are in contact with a contact area 160 of the printed circuit 102. For establishing the electrical contact between the printed circuit 103 and the display 110, the tab 150 is folded towards the display and it is inserted through a slot 170 of the window device 120 so as to let its back face 152 come into contact with the contact area 140 of the display. Thus, the pressure necessary for establishing the electrical contact between the display 110 and the printed circuit 102 is ensured by the window device 120 which is kept in place by the clips 130.

The contact device according to the invention is thus formed by the contact areas 140 and 160, the tab 150 and its contact tracks 155 and the window device 120, which ensures the pressure.

In a first embodiment of the invention, the contact tracks 155 of the tab 150 are engraved on the tab with conducting ink. In a second embodiment of the invention, they are formed by fine metallic lamellae on which the elastic material forming the tab has been poured. This second embodiment offers the advantage of being particularly robust. It is thus preferably used when the tab is to be folded back to ensure the contact, as this is the case in FIGS. 2 and 3, in order to avoid possible microcuts of the tracks due to the folding of the sheet.

Figure 4:
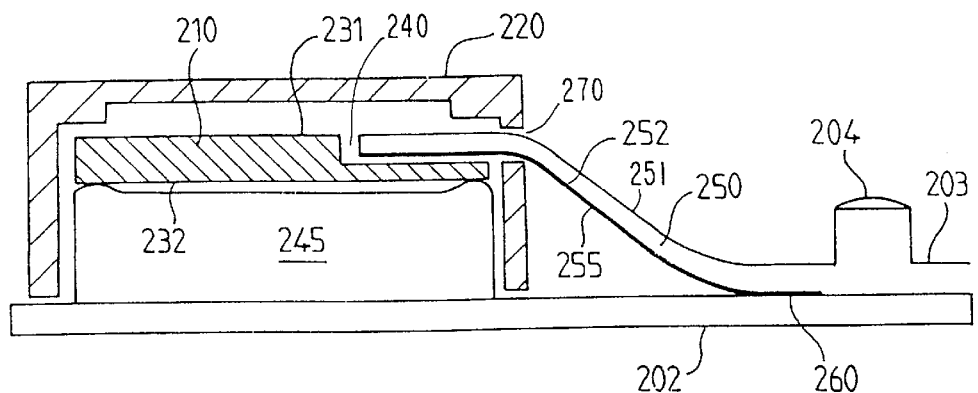
FIG. 4 represents a cross-sectional view of a part of another example of equipment according to the invention.

The fact that the tab 150 is folded to ensure the contact is linked with the configuration of the equipment and with the arrangement with respect to each other of the various elements it contains. With other forms of equipment or other arrangements of these elements, the tab would not necessarily be folded. By way of example, FIG. 4 diagrammatically shows equipment according to the invention in which the tab is not folded. In the equipment of FIG. 4, the display 210 has a front face 231, a back face 232 and a contact area 240 on its front face 231. A support 245 is provided for the display 210. This support is formed, for example, by a foam block. The elastomer sheet 203 carries keys 204 and a tab 250 having a front face 251 and a back face 252. The tab 250 has various contact tracks 255 on its back face 252. These tracks 255 are in contact with the contact area 260 of the printed circuit 202. For establishing the electrical contact between the display and the printed circuit, the tab 250 is inserted through a slot 270 of a window device 220, so that its back face 252 is in contact with the contact area 240 of the display. The window device 220 is kept in place on the printed circuit by clips (not shown), so that the pressure between the contact surfaces (contact area 240/tracks 255, on the one hand, and tracks 255/contact area 260, on the other hand) is ensured.

A man of ordinary skill in the art can very well imagine other variants of the embodiments that have just been described, for example, equipment in which the display and the keys are found on opposite surfaces.

What is claimed is:

1. Electronic equipment comprising a liquid crystal display, a printed circuit and an electrical contact device between said display and said printed circuit, wherein the electronic equipment includes a sheet of elastic material having keys, said keys being molded in said sheet, said electrical contact device being formed by a tab connected to in said sheet and carrying one or various contact tracks for electrical connection between said display and said printed circuit.

2. The electronic equipment as claimed in claim 1, wherein said contact tracks are engraved on said tab with conducting ink.

3. The electronic equipment as claimed in claim 1, wherein said contact tracks are formed by metallic lamellae on which the elastic material forming the tab has been poured.

4. The electronic equipment as claimed in claim 1, further comprising a pressure device for holding said display on said tab, wherein said tab contacts said display through a slot of said pressure device.

5. The electronic equipment as claimed in claim 1, wherein said contact tracks at a first end of said tab fixed to said sheet provide electrical connection to said printed circuit, and said tracks at a free end of said tab provide electrical connection to said display.

6. The electronic equipment as claimed in claim 1, further comprising a pressure device for holding said display on said tab, wherein said tab is folded to a substantially c-shape to contact said display through a slot of said pressure device.

7. The electronic equipment as claimed in claim 1, wherein said tab is folded to a substantially c-shape between said printed circuit and said display to provide said electrical connection.

8. The electronic equipment as claimed in claim 1, wherein said tab has a free end and a fixed end, and said printed circuit has a circuit contact area and said display has a display contact area, the free end of said tab being placed opposite the display contact area, and the fixed end being placed opposite the circuit contact area, the electrical contact being ensured by at least one mechanical pressure device.

9. A device to establish an electrical contact between a liquid crystal display and a printed circuit of an electronic equipment having keys, wherein the device includes a tab having at least one contact track for electrical connection between said display and said printed circuit, and wherein the tab is connected to in a sheet of elastic material of said electronic equipment, said keys being molded in said sheet.

10. A sheet of elastic material having keys which are molded in said sheet, said sheet being included in an electronic equipment that comprises a display which is connected to a printed circuit by a tab of said sheet, said tab having conducting tracks for electrical connection between said display and said printed circuit.

* * * * *